United States Patent [19]
Das et al.

[11] Patent Number: 5,990,453
[45] Date of Patent: Nov. 23, 1999

[54] HIGH PRESSURE/HIGH TEMPERATURE PROCESS CHAMBER

[75] Inventors: Ashok K. Das, Sunnyvale; Joe Stevens, San Jose; Erich Tzou, Mountain View; Matt Tsai, Sunnyvale, all of Calif.

[73] Assignee: Applied Materials, Inc., Santa Clara, Calif.

[21] Appl. No.: 08/982,683

[22] Filed: Dec. 2, 1997

[51] Int. Cl.$^6$ .................................................. A21B 1/00
[52] U.S. Cl. ........................... 219/405; 219/390; 219/411
[58] Field of Search .................................. 219/390, 405, 219/411; 392/416, 418; 118/724, 725, 50.1

[56] References Cited

U.S. PATENT DOCUMENTS

| | | | |
|---|---|---|---|
| 4,472,622 | 9/1984 | Satoh et al. | 219/390 |
| 4,533,820 | 8/1985 | Shimizu | 219/411 |
| 4,558,660 | 12/1985 | Nishizawa et al. | 118/725 |
| 4,789,771 | 12/1988 | Robinson et al. | 219/405 |
| 5,414,244 | 5/1995 | Imahashi | 219/497 |
| 5,446,825 | 8/1995 | Moslehi et al. | 392/416 |
| 5,490,228 | 2/1996 | Soma et al. | 392/416 |
| 5,493,987 | 2/1996 | McDiarmid et al. | 117/102 |
| 5,800,618 | 9/1998 | Niori et al. | 118/723 |

Primary Examiner—Teresa Walberg
Assistant Examiner—Shawntina Fuqua
Attorney, Agent, or Firm—Dugan & Dugan

[57] ABSTRACT

An improved processing chamber is provided that withstands numerous high pressure/high temperature processing cycles without heater breakage. The processing chamber contains a high conductivity, a high emissivity and/or a high transmissivity shield positioned in sufficient proximity to a heater to prohibit gas currents such as convection current loops from forming between the shield and the heater. The shield is preferably a thin anodized metal or a sapphire sheet.

22 Claims, 2 Drawing Sheets

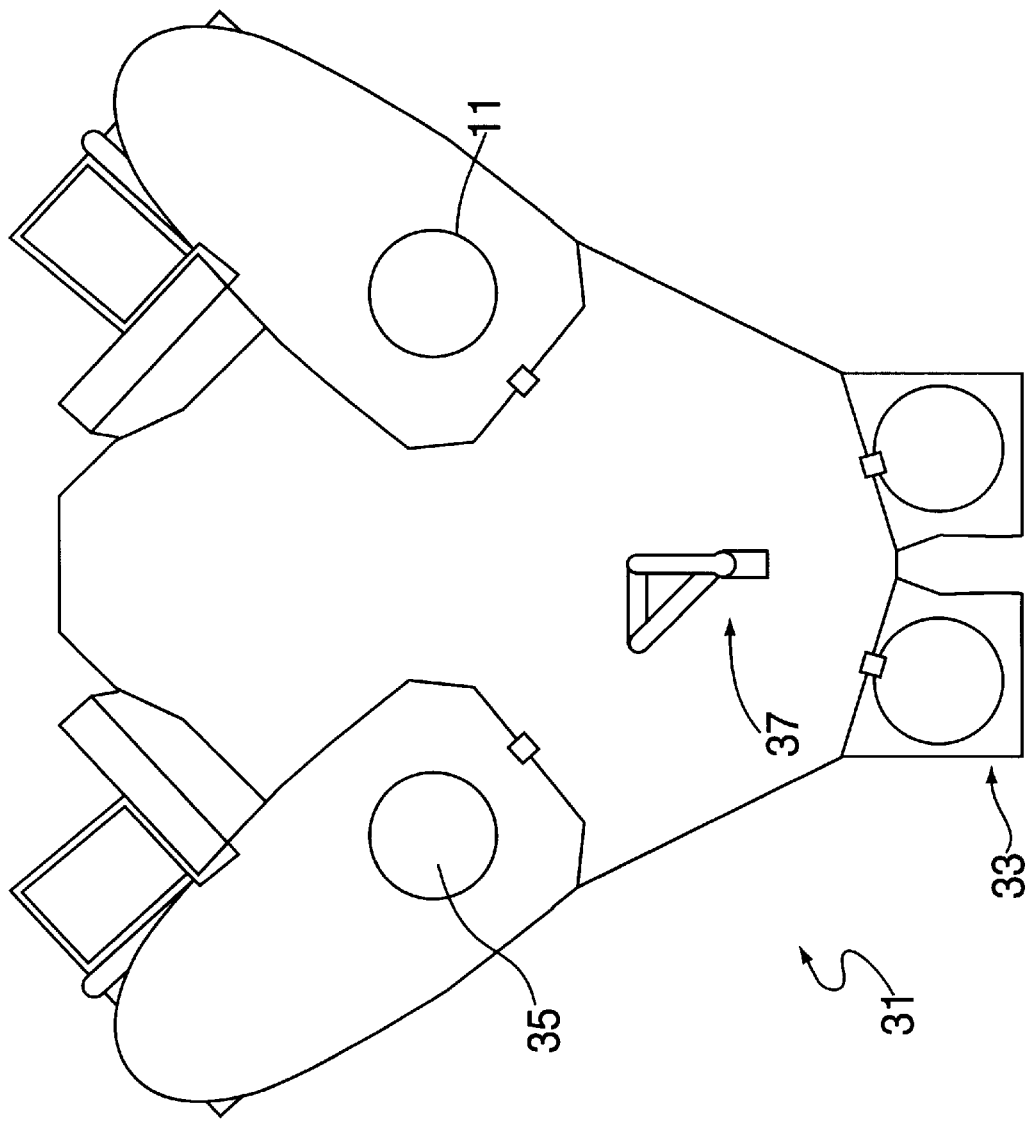

HIGH PRESSURE/HIGH TEMPERATURE PROCESS CHAMBER

BACKGROUND OF THE INVENTION

The present invention relates to a method and apparatus for extending heater life, and specifically to a method and apparatus for extending the life of a brittle heater within a non-vacuum semiconductor processing chamber.

Many common semiconductor devices require vertical surface features (i.e., vias, trenches, holes or other similar topographical features) in order to connect distinct planes of material (e.g., for device electrical connections) or to increase device surface area (e.g., for capacitors). With shrinking lateral device dimensions, vertical surface features have become increasingly important for maintaining adequate device surface area by replacing horizontal (e.g., planar) surface area with vertical (e.g., three dimensional) surface area.

During the formation of vertical surface features, deposited material can cling to the side walls of these features, blocking deposited material from reaching the lower surfaces of the features and causing formation of hollow areas (voids) which affect device quality. This problem is exacerbated with decreased lateral device dimensions. Recently, the practice of placing a semiconductor device within a high temperature/high pressure chamber (known as isostatic pressing) has been employed to collapse such voids, causing them to fill with hot deposited material. Isostatic pressing thus creates consistently higher quality devices through void elimination. High temperatures allow the deposited material to collapse and to flow more easily into voids and may also be employed to control crystal orientation.

Attempts to develop a commercially viable isostatic pressing chamber have failed because ceramic heaters (pervasively used in semiconductor processing because of their efficient heat transfer and electrically insulating properties) cannot survive even one isostatic pressing cycle. Specifically, in an isostatic pressing chamber having an upper heater and a lower heater, and having a wafer mounted proximate to the upper heater, the lower heater may fail by fracture during even the first high temperature/high pressure isostatic pressing cycle. Heater cracking requires heater replacement after each cycle, intolerably increases processing cost per semiconductor device and, moreover, generates particles which may destroy any devices being processed. Accordingly, a processing chamber must be developed that is able to withstand the repeated high temperature/high pressure cycling necessary to make isostatic pressing and its benefits a commercial reality.

SUMMARY OF THE INVENTION

The present invention allows a ceramic or a similarly brittle heater to survive multiple high pressure/high temperature processing cycles. Specifically, it has been discovered that within conventional processing chambers a heater may break due to thermal gradients across the heater's surface caused by gas currents, such as convection currents which flow between high temperature regions near the heaters and low temperature regions distant from the heaters, thereby inducing localized thermal stresses in the heater which exceed the ultimate strength of the material. The present invention provides a non-production object, that is, an object that is part of the processing equipment rather than an object that is being processed, (e.g., a shield) to block gas currents from reaching the surface of the lower heater. The shield is placed proximate the lower heater (i.e., positioned so as to deter formation of gas currents that can cause a destructive thermal gradient across the heater). Most preferably the shield is placed in sufficient proximity to a heater so that the small space between the shield and the heater prevents the formation of currents that can cause thermal gradients across the heater's surface. The shield preferably has high emissivity, transmissivity and/or high conductivity characteristics, so that heat is readily transferred therethrough. A shield comprising a thin metal (preferably copper or a copper alloy) which is roughened or otherwise treated to increase emissivity, or a highly transmissive material (such as sapphire) is preferred.

Other objects, features and advantages of the present invention will become more fully apparent from the following detailed description of the preferred embodiments, the appended claims and the accompanying drawings.

BRIEF DESCRIPTION OF THE DRAWINGS

FIG. 2 is a top plan view of a semiconductor device fabrication system employing the inventive processing chamber of FIG. 1.

DETAILED DESCRIPTION OF THE PREFERRED EMBODIMENTS

Figure 1:
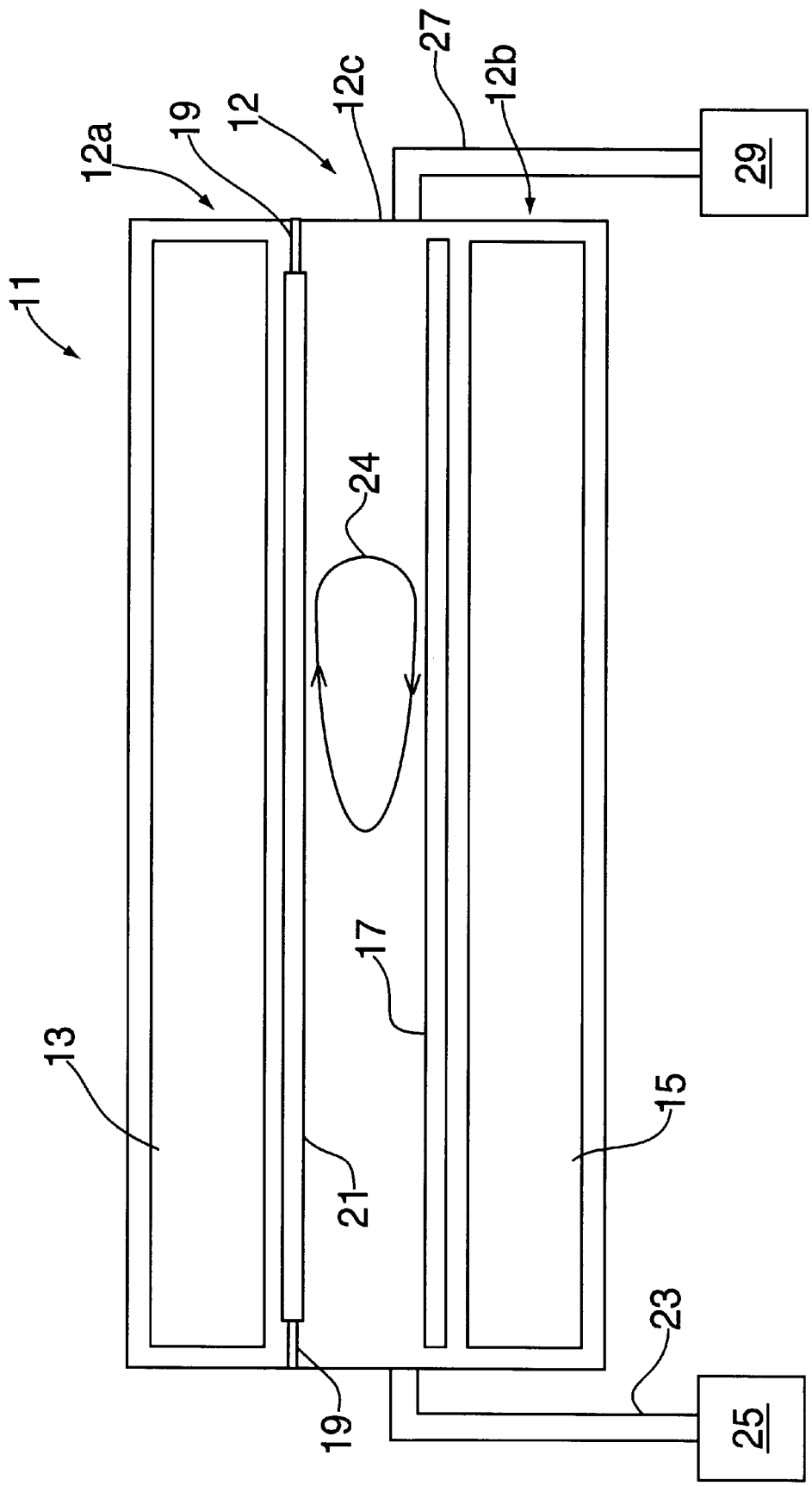
FIG. 1 is a side elevational view of the inventive processing chamber.

FIG. 1 is a side elevational view of an inventive processing chamber 11 made in accordance with the present invention. The processing chamber 11 comprises a processing region 12 having an upper region 12a, a lower region 12b and a central region 12c. The processing region 12 contains a first heater, for example, an upper heater 13 positioned in the upper portion 12a of the process region 12 and a second heater, for example, a lower heater 15 positioned in the lower portion 12b of the processing region 12. A shield 17 is positioned proximate to the lower heater 15. The shield 17 may be coupled to the interior walls of the processing chamber 11, or to the lower heater 15, etc.

The configuration and placement of the shield 17 is such that the shield 17 blocks convection currents which form within the processing chamber 11 from reaching the heater 15 in amounts sufficient to cause a thermal gradient thereacross (as described further below), and so as to allow heat to be efficiently conducted from the heater 15 to the wafer 21. In order to block convection currents from reaching the heater 15, the shield 17 is preferably mounted close to the heater 15, extends the length of the heater 15, and may abut the inner walls of the processing chamber 11.

In order to allow heat to be efficiently conducted from the heater 15 to the wafer 21, the shield 17 maybe highly transmissive, so as to allow heat to efficiently pass therethrough, or may be both highly conductive and emissive. High emissivity allows the shield 17 to efficiently absorb and re-radiate heat; high conductivity allows the shield 17 to compensate for thermal gradients which may occur in the atmosphere surrounding the shield 17.

For example, isolated areas of higher temperature may accumulate near the center of the heater 15. A highly emissive shield will efficiently absorb and re-radiate heat; thermal gradients will be absorbed by the shield and re-radiated to the wafer. A shield which is highly conductive absorbs the thermal gradients; the absorbed (uneven) heat is then more evenly conducted across the shield 17. Thus, a shield which is both highly conductive and highly emissive compensates somewhat for thermal gradients by absorbing heat from areas of unequal temperature, redistributing the heat across the surface of the shield 17, and thereafter emitting the evenly distributed heat. Accordingly, thermal gradients are not transmitted to the wafer and more even, high quality wafer processing is achieved.

A wafer mounting mechanism represented generally by the reference numeral 19 is positioned adjacent the upper heater 13 and is shown supporting a production object (i.e., an object that is processed within the processing chamber) such as a substrate or a wafer 21. The wafer mounting mechanism 19 preferably holds the wafer 21 proximate the upper heater 13. A gas inlet 23 couples a high pressure gas source 25 in fluid communication with the processing chamber 11, and a gas outlet 27 couples a pump (preferably a vacuum pump 29) in fluid communication with the processing chamber 11. A gas current such as a convection current loop is generally represented by numeral 24.

In an exemplary operation, after the upper heater 13 and the lower heater 15 have stabilized at the processing temperature, a wafer 21 having a high aspect ratio surface feature (i.e., a feature with a vertical dimension greater than its lateral dimension) formed thereon is placed on the wafer mounting mechanism 19 by a robot (not shown). The robot retracts through a sealable port (not shown) in the processing chamber 11, and the sealable port closes. A high pressure gas such as 12,000 psi argon flows from the high pressure gas source 25 into the processing chamber 11 via the gas inlet 23. The high pressure gas continues to flow into the processing chamber 11 until the processing chamber 11 reaches 12,000 psi; thereafter a valve (not shown) coupled to the gas inlet 23 closes. The high pressure gas conducts heat from the upper heater 13 directly to the wafer 21 and from the lower heater 15 through the shield 17 (which is preferably a highly conductivity and highly emissive material or a highly transmissive material) to the wafer 21, thereby softening a layer on the wafer 21 in which voids to be eliminated are present. The high pressure and high temperature within the processing region 12 promote the collapse of any voids which may exist in the topographical surface features of the wafer 21 and therefore improve device reliability.

During heating, concentrated regions of high temperature or low temperature, relative to other regions of the heaters, may form adjacent the surfaces of the upper heater 13 and the lower heater 15. In accordance with the principles of convection, the high pressure gas within the processing chamber 11 elevates as it heats and descends as it cools, forming the convection current loop 24. Although only one such loop is shown, several paths of gas exhibiting temperature induced flow may occur in the region between the heaters, and thereby induce multiple temperature gradients across the heaters. As this gas travels in the convection loop 24 the addition of the inventive shield 17 blocks the descending cooler gas from reaching the surface of the lower heater 15. Simulation data (not shown) suggests that the gas near the side walls of the processing chamber 11 cools and descends in significantly greater quantities than the gas near the center of the processing region. The convection loop 24 may thus induce a thermal gradient across the surface of the shield 17 (or, if no shield is present, across the surface of the heater 15), with the cooler regions of the shield located near the side walls of the processing chamber 11 and the hotter regions of the shield located near the center thereof. Because the shield 17 is made of a less brittle material (such as metal, sapphire, etc.) which can withstand a substantial thermal gradient and/or sudden changes in temperature (i.e., thermal shock) without fracture, the shield 17 will not break under the strain of the thermal gradient induced by the convection loop 24.

The shield 17 prevents the convection loop 24 from reaching the lower heater 15, thus inducing the thermal gradient across the shield 17 but allowing the temperature across the surface of the lower heater 15 to remain relatively uniform, and thereby preventing the lower heater 15 from breaking during a high pressure/high temperature isostatic pressing cycle. In operation, the thermal gradient across the shield is diffused through the gas layer existing between the shield 17 and the lower heater 15, and thus the lower heater 15 maintains a temperature profile sufficiently uniform to prevent cracking. Preferably, the space between the lower heater 15 and the shield 17 is sufficiently small to prevent any convection loops from forming therebetween. A space in the range of 0.020 to 0.125 inches between the lower heater 15 and the shield 17 is preferred.

Due to the small gap between the wafer 21 and the upper heater 13, convection loops are less likely to form in the space between the wafer 21 and the upper heater 13 (as hot gas near the upper heater 13 remains near the upper heater 13). Nevertheless, in order to prevent a convection loop from forming therein, a space between the wafer 21 and the upper heater 13 in the range of 0.030 to 0.090 inches is preferred. It will be understood, however, that the preferred spacing to prevent convection loops is pressure dependent; smaller spacing between the shield 17 and the heater 15 being preferred for higher chamber pressures; and lower chamber pressures allowing larger spacing between the shield 17 and the heater 15.

After processing is complete, a valve (not shown) coupled to the gas outlet 27 is opened and the vacuum pump 29 pumps gas from the processing chamber 11 until a desired vacuum level is achieved. Thereafter the sealable port (not shown) opens and the robot (not shown) extracts the wafer 21 from the processing chamber 11, and the process repeats. The heaters may or may not cool to ambient temperatures between processing cycles.

With use of the inventive processing chamber 11 both the upper heater 13 and the lower heater 15 are protected from convection loops that cause destructive thermal gradients across heater surfaces, while heat is nonetheless efficiently conducted to both the upper and lower surface of the wafer 21. The benefits of non-vacuum, high temperature processing are therefore made economical and efficient as thermal gradient induced heater breakage is eliminated.

FIG. 2 is a top plan view of a fabrication system 31 that employs the inventive processing chamber 11 of FIG. 1. The fabrication system 31 comprises at least a first load lock 33, at least one deposition chamber 35, at least one wafer handler 37 and the inventive processing chamber 11.

In operation, a wafer carrier (not shown) containing at least one wafer is loaded into the first load lock 33, and the first load lock 33 is pumped to a desired vacuum level. The wafer handler 37 extracts a first wafer from the wafer carrier and transports the wafer to the deposition chamber 35. A sealable port such as a slit valve (not shown) of the deposition chamber 35 opens allowing the wafer handler 37 to reach into the deposition chamber 35 and deposit the first wafer therein. The wafer handler 37 retracts and the slit valve closes. A film is then deposited on the first wafer. After film deposition, the slit valve opens and the wafer handler 37 extracts the first wafer from the deposition chamber 35 and carries the wafer to the inventive processing chamber 11.

A sealable port such as a slit valve (not shown) of the inventive processing chamber 11 opens allowing the wafer handler 37 to reach into the inventive processing chamber 11 and deposit the first wafer therein. The wafer handler 37 retracts and the slit valve closes. The wafer is then isostatically pressed in accordance with the invention as described with reference to FIG. 1. After isostatic pressing within the inventive processing chamber 11 is complete and the processing chamber 11 is evacuated as previously described, the slit valve (not shown) opens and the wafer handler 37 extracts the first wafer and returns the first wafer to the first load lock 33. The sequence repeats until each wafer within the wafer carrier has been processed and returned to the first load lock 33.

With use of the inventive processing chamber, each wafer within the wafer carrier can be processed without requiring a single heater replacement. Thus, the present invention allows isostatic pressing and its many benefits to be incorporated within commercial fabrication equipment.

The foregoing description discloses only the preferred embodiments of the invention, modifications of the above disclosed apparatus and method which fall within the scope of the invention will be readily apparent to those of ordinary skill in the art. For instance, the positioning and orientation of the heaters may vary; upper and lower positioning within the chamber is merely preferred. For example, the heaters may be vertically positioned along the side walls of the processing chamber. Similarly, a shield can be employed, in any orientation, to protect a heater from thermal gradients caused by gas currents and any shield employed to protect a heater from destructive gas currents will fall within the scope of the invention.

Accordingly, while the present invention has been disclosed in connection with the preferred embodiments thereof, it should be understood that other embodiments may fall within the spirit and scope of the invention, as defined by the following claims.

The invention claimed is:

1. A processing chamber comprising:
   a processing region comprising an upper portion, a lower portion and a central portion;
   a heater positioned within the processing region; and
   a heat conducting shield positioned proximate to the heater so as to protect the heater from convection currents that induce a destructive thermal gradient across the heater.

2. The processing chamber of claim 1 wherein the heater is positioned in the lower portion of the processing region.

3. The processing chamber of claim 2 wherein an additional heater is positioned in the upper portion of the processing region, and a wafer mounting mechanism is positioned to hold a wafer proximate the additional heater.

4. A processing chamber comprising:
   a processing region comprising an upper portion, a lower portion and a central portion;
   an upper heater positioned in the upper portion of the processing region;
   a lower heater positioned in the lower portion of the processing region;
   a wafer mounting mechanism for mounting a wafer adjacent one of the upper and lower heaters; and
   a shield positioned proximate one of the upper and lower heaters that is not adjacent the wafer mounting mechanism so as to protect the heater from convection currents that induce a destructive thermal gradient across the heater.

5. The processing chamber of claim 4 wherein the wafer mounting mechanism is for mounting a wafer adjacent the upper heater.

6. The processing chamber of claim 5 wherein the shield is mounted proximate the lower heater and is positioned between the lower heater and the central portion of the processing region.

7. The processing chamber of claim 6 wherein the shield has high transmissivity.

8. The processing chamber of claim 6 wherein the shield has high emissivity.

9. The processing chamber of claim 6 wherein the shield has high emissivity and high conductivity.

10. The processing chamber of claim 9 wherein the shield is a metal sheet.

11. The processing chamber of claim 9 wherein the shield is a sapphire sheet.

12. A method of protecting a heater from gas currents comprising:
   providing a processing region having a heater; and
   positioning a shield proximate the heater and between the heater and the substrate;
   wherein positioning the shield proximate the heater protects the heater from convection currents that induce a destructive thermal gradient across the heater.

13. The method of claim 12 further comprising: placing a substrate within the processing region; and heating the substrate with the heater.

14. The method of claim 13 wherein placing the substrate within the processing region comprises placing the substrate above the shield.

15. A method of protecting a heater from gas currents comprising:
   providing a processing chamber having a processing region, the processing region having an upper heater positioned in an upper portion of the processing region and a lower heater positioned in a lower portion of the processing region;
   placing a substrate within the processing region between the upper and the lower heaters;
   heating the substrate; and
   protecting at least one of the upper and lower heaters from convection currents that induce a thermal gradient across the at least one heater by positioning a shield proximate the at least one heater and between the at least one heater and the substrate.

16. A substrate processed in accordance with the method of claim 12.

17. A semiconductor device fabrication system comprising:
   a deposition chamber for depositing a thin film on a wafer; and
   the processing chamber of claim 1 for isostatically pressing the wafer following thin film deposition within the deposition chamber.

18. A method of isostatic pressing an object comprising:
   providing a processing chamber;
   providing a heater within the processing chamber;
   shielding the heater from convection loops within the processing chamber that induce a destructive thermal gradient across the heater;
   pressurizing the processing chamber;
   heating the processing chamber; and
   placing the object within the processing chamber and thereby isostatic pressing the object.

19. The method of claim 18 further comprising:
   transferring heat from the heater through a shield to the object.

20. The method of claim 19 wherein transferring heat from the heater through the shield to the object comprises absorbing heat and emitting heat.

21. The method of claim 19 wherein transferring heat from the heater through the shield to the object comprises absorbing heat; distributing the absorbed heat evenly; and transmitting the absorbed heat evenly to the object.

22. A processing chamber comprising:

a processing region comprising an upper portion, a lower portion and a central portion;

an upper heater positioned in the upper portion of the processing region;

a lower heater positioned in the lower portion of the processing region;

a wafer mounting mechanism for mounting a wafer adjacent the upper heater; and a high emissivity and high conductivity sapphire sheet shield positioned proximate the lower heater and positioned between the lower heater and the central portion of the processing region.

* * * * *